United States Patent
Takenaga et al.

(10) Patent No.: US 9,453,683 B2
(45) Date of Patent: Sep. 27, 2016

(54) HEAT TREATMENT SYSTEM, HEAT TREATMENT METHOD, AND PROGRAM

(71) Applicant: TOKYO ELECTRON LIMITED, Tokyo (JP)

(72) Inventors: Yuichi Takenaga, Oshu (JP); Daisuke Kudo, Yokkaichi (JP)

(73) Assignee: TOKYO ELECTRON LIMITED (JP)

( * ) Notice: Subject to any disclaimer, the term of this patent is extended or adjusted under 35 U.S.C. 154(b) by 505 days.

(21) Appl. No.: 13/799,491

(22) Filed: Mar. 13, 2013

(65) Prior Publication Data
US 2013/0260328 A1    Oct. 3, 2013

(30) Foreign Application Priority Data
Mar. 28, 2012 (JP) ................... 2012-075056

(51) Int. Cl.
| F27D 19/00 | (2006.01) |
| F27B 17/00 | (2006.01) |
| H01L 21/67 | (2006.01) |
| C23C 16/46 | (2006.01) |
| H01L 21/02 | (2006.01) |

(52) U.S. Cl.
CPC ............ F27D 19/00 (2013.01); C23C 16/46 (2013.01); F27B 17/0025 (2013.01); H01L 21/67248 (2013.01); H01L 21/0262 (2013.01); H01L 21/02532 (2013.01); H01L 21/02576 (2013.01)

(58) Field of Classification Search
CPC .... F27D 19/00; C23C 16/46; F27B 17/0025; H01L 21/67248; H01L 21/02532; H01L 21/02576; H01L 21/0262
USPC .................. 118/663, 695, 697; 156/345.24, 156/345.26–345.27
See application file for complete search history.

(56) References Cited

U.S. PATENT DOCUMENTS

| 5,001,327 A * | 3/1991 | Hirasawa .......... H01L 21/67109 118/729 |
| 5,324,920 A * | 6/1994 | Nakao ..................... C30B 25/10 219/385 |
| 5,418,885 A * | 5/1995 | Hauser ..................... C23C 8/10 118/724 |
| 5,900,177 A * | 5/1999 | Lecouras ................ C30B 25/10 219/483 |
| 6,015,465 A * | 1/2000 | Kholodenko ......... H01J 37/321 118/712 |
| 6,329,643 B1 * | 12/2001 | Suzuki .................... C30B 25/10 219/497 |
| 6,342,691 B1 * | 1/2002 | Johnsgard ......... H01L 21/67115 118/50.1 |

(Continued)

FOREIGN PATENT DOCUMENTS

| JP | 11121389 | 4/1999 |
| JP | 2008218709 | 9/2008 |

Primary Examiner — Rudy Zervigon
(74) Attorney, Agent, or Firm — Cantor Colburn LLP

(57) ABSTRACT

A controller of a heat treatment apparatus forms a phosphorous-doped polysilicon film (D-poly film) on a semiconductor wafer, and determines whether the D-poly film satisfies a target heat treatment characteristic. When it is determined that the target heat treatment characteristic is not satisfied, the controller calculates a temperature in a reaction tube and flow rates of process gas supply pipes, which satisfy the target heat treatment characteristic, based on a heat treatment characteristic of the D-poly film and a model indicating relationships between changes in the temperature in the reaction tube and the flow rates of the process gas supply pipes, and a change in a heat treatment characteristic. The controller forms the D-poly film on the semiconductor wafer according to heat treatment conditions including the calculated temperature and the calculated flow rates, so as to satisfy the target heat treatment characteristic.

2 Claims, 11 Drawing Sheets

| | | TEMPERATURE [°C] | | | PH₃ FLOW RATE [sccm] | | |
|---|---|---|---|---|---|---|---|
| | | TOP | CTR | BTM | TOP | CTR | BTM |
| FILM THICKNESS [nm] | Slot5(TOP) | 2.0 | -0.1 | 0.0 | -0.3 | 0.0 | 0.0 |
| | Slot85(CTR) | -0.1 | 2.0 | -0.1 | -0.1 | -0.3 | 0.0 |
| | Slot161(BTM) | 0.0 | -0.1 | 2.0 | -0.1 | -0.2 | -0.3 |
| P CONCENTRATION (E+20) [atoms/cm³] | Slot5(TOP) | -0.2 | 0.0 | 0.0 | 0.3 | 0.0 | 0.0 |
| | Slot85(CTR) | 0.0 | -0.2 | 0.0 | 0.1 | 0.3 | 0.0 |
| | Slot161(BTM) | 0.0 | 0.0 | -0.2 | 0.1 | 0.2 | 0.3 |

(56) References Cited

U.S. PATENT DOCUMENTS

| | | | | |
|---|---|---|---|---|
| 7,179,334 B2* | 2/2007 | Sakamoto | H01L 21/67253 | 118/663 |
| 7,309,395 B2* | 12/2007 | Lee | B05D 1/60 | 118/696 |
| 7,883,581 B2* | 2/2011 | Nakaiso | C23C 16/345 | 118/696 |
| 8,007,275 B2* | 8/2011 | Surthi | F27B 17/0025 | 432/247 |
| 8,354,135 B2* | 1/2013 | Takenaga | C23C 16/402 | 427/248.1 |
| 9,028,614 B2* | 5/2015 | Hara | C30B 25/08 | 118/724 |
| 9,207,665 B2* | 12/2015 | Takahashi | H01L 21/67109 | |
| 2001/0046556 A1* | 11/2001 | Horiuchi | B01J 2/30 | 427/212 |
| 2001/0054387 A1* | 12/2001 | Frankel | G07C 15/006 | 118/725 |
| 2002/0073922 A1* | 6/2002 | Frankel | C23C 16/401 | 118/715 |
| 2002/0074324 A1* | 6/2002 | Wang | C30B 25/16 | 219/494 |
| 2002/0121241 A1* | 9/2002 | Nguyen | C23C 16/4401 | 118/715 |
| 2002/0121342 A1* | 9/2002 | Nguyen | C23C 16/4401 | 156/345.33 |
| 2003/0066486 A1* | 4/2003 | Zheng | C23C 16/4405 | 118/723 ME |
| 2003/0077920 A1* | 4/2003 | Noda | C23C 16/24 | 438/788 |
| 2003/0109071 A1* | 6/2003 | Wang | H01L 21/324 | 438/14 |
| 2003/0183614 A1* | 10/2003 | Yamaguchi | C30B 31/10 | 219/390 |
| 2004/0035529 A1* | 2/2004 | Grimbergen | H01L 21/67253 | 156/345.24 |
| 2004/0144320 A1* | 7/2004 | Hasebe | B08B 7/00 | 118/724 |
| 2004/0215365 A1* | 10/2004 | Obara | C23C 16/52 | 700/213 |
| 2004/0247787 A1* | 12/2004 | Mackie | C23C 16/40 | 427/248.1 |
| 2005/0072525 A1* | 4/2005 | Pancham | C23C 18/1628 | 156/345.11 |
| 2005/0072526 A1* | 4/2005 | Nguyen | C23C 18/1619 | 156/345.11 |
| 2005/0082002 A1* | 4/2005 | Sato | B08B 7/00 | 156/345.29 |
| 2007/0074660 A1* | 4/2007 | Park | H01L 21/67248 | 118/715 |
| 2007/0195853 A1* | 8/2007 | Park | C23C 16/46 | 374/1 |
| 2007/0282554 A1* | 12/2007 | Koyama | G05B 23/0221 | 702/105 |
| 2008/0182345 A1* | 7/2008 | Sugishita | H01L 22/20 | 438/7 |
| 2008/0213478 A1* | 9/2008 | Matsuura | C23C 16/36 | 427/255.28 |
| 2008/0213716 A1* | 9/2008 | Koyama | H01L 21/67248 | 432/1 |
| 2008/0228308 A1* | 9/2008 | Phelps | H01L 21/67248 | 700/121 |
| 2008/0255683 A1* | 10/2008 | Takahashi | G05D 23/1935 | 700/42 |
| 2009/0078197 A1* | 3/2009 | Takenaga | H01L 21/67276 | 118/708 |
| 2009/0095422 A1* | 4/2009 | Sugishita | C23C 16/4411 | 156/345.27 |
| 2009/0110824 A1* | 4/2009 | Takenaga | C23C 16/52 | 427/248.1 |
| 2009/0117259 A1* | 5/2009 | Kataoka | H01L 21/02238 | 427/9 |
| 2009/0170338 A1* | 7/2009 | Terasaki | C23C 16/4412 | 438/758 |
| 2009/0197409 A1* | 8/2009 | Morita | C23C 16/4401 | 438/680 |
| 2009/0232967 A1* | 9/2009 | Takenaga | C23C 16/402 | 427/9 |
| 2009/0311807 A1* | 12/2009 | Yamaga | H01L 21/67109 | 438/5 |
| 2010/0236480 A1* | 9/2010 | Hara | C23C 16/4481 | 118/725 |
| 2010/0273290 A1* | 10/2010 | Kryliouk | C23C 16/303 | 438/99 |
| 2010/0275848 A1* | 11/2010 | Fukuda | C23C 16/325 | 118/728 |
| 2010/0297832 A1* | 11/2010 | Imai | C23C 16/325 | 438/478 |
| 2012/0064472 A1* | 3/2012 | Yoshii | F27B 17/0025 | 432/42 |
| 2012/0223066 A1* | 9/2012 | Yoshii | F27B 17/0025 | 219/390 |
| 2013/0042803 A1* | 2/2013 | Saido | C23C 16/45578 | 117/88 |
| 2013/0204416 A1* | 8/2013 | Takahashi | H01L 21/67109 | 700/95 |
| 2013/0260328 A1* | 10/2013 | Takenaga | F27D 19/00 | 432/9 |
| 2013/0260572 A1* | 10/2013 | Takenaga | H01L 22/12 | 438/758 |
| 2013/0327273 A1* | 12/2013 | Okada | C23C 16/4405 | 118/715 |
| 2014/0134827 A1* | 5/2014 | Swaminathan | H01L 21/76224 | 438/437 |
| 2015/0270183 A1* | 9/2015 | Takenaga | H01L 22/20 | 702/81 |

* cited by examiner

FIG. 4

| | | TEMPERATURE [°C] | | | PH₃ FLOW RATE [sccm] | | |
|---|---|---|---|---|---|---|---|
| | | TOP | CTR | BTM | TOP | CTR | BTM |
| FILM THICKNESS [nm] | Slot5(TOP) | 2.0 | -0.1 | 0.0 | -0.3 | 0.0 | 0.0 |
| | Slot85(CTR) | -0.1 | 2.0 | -0.1 | -0.1 | -0.3 | 0.0 |
| | Slot161(BTM) | 0.0 | -0.1 | 2.0 | -0.1 | -0.2 | -0.3 |
| P CONCENTRATION (E+20) [atoms/cm³] | Slot5(TOP) | -0.2 | 0.0 | 0.0 | 0.3 | 0.0 | 0.0 |
| | Slot85(CTR) | 0.0 | -0.2 | 0.0 | 0.1 | 0.3 | 0.0 |
| | Slot161(BTM) | 0.0 | 0.0 | -0.2 | 0.1 | 0.2 | 0.3 |

FIG. 6

| | Slot | TARGET FILM THICKNESS(nm) | TARGET P CON-CENTRATION (E+20) [atoms/cm³] |
|---|---|---|---|
| TOP | 5 | 100.00 | 5.00 |
| CTR | 85 | 100.00 | 5.00 |
| BTM | 161 | 100.00 | 5.00 |

FIG. 7A

| TOP | 580.0 |
| --- | --- |
| CTR | 580.0 |
| BTM | 580.0 |

DEPO TEMPERATURE (°C)

FIG. 7B

| TOP | 40.0 |
| --- | --- |
| CTR | 30.0 |
| BTM | 80.0 |

$PH_3$ FLOW RATE (sccm)

FIG. 8

| Slot | MEASURED FILM THICKNESS(nm) | MEASURED P CONCENTRATION (E+20) [atoms/cm³] |
|---|---|---|
| TOP | 5 | 95.00 | 4.90 |
| CTR | 85 | 100.00 | 5.10 |
| BTM | 161 | 105.00 | 5.30 |

FIG. 9A

| TOP | 582.8 |
|---|---|
| CTR | 579.9 |
| BTM | 577.1 |

DEPO TEMPERATURE (°C)

FIG. 9B

| TOP | 42.2 |
|---|---|
| CTR | 28.9 |
| BTM | 77.0 |

$PH_3$ FLOW RATE (sccm)

HEAT TREATMENT SYSTEM, HEAT TREATMENT METHOD, AND PROGRAM

CROSS-REFERENCE TO RELATED PATENT APPLICATIONS

This application claims the benefit of Japanese Patent Application No. 2012-075056, filed on Mar. 28, 2012, in the Japan Patent Office, the disclosure of which is incorporated herein in its entirety by reference.

BACKGROUND OF THE INVENTION

1. Field of the Invention

The present invention relates to a heat treatment system, a heat treatment method, and a program, which perform heat-treatment on an object to be processed, such as a semiconductor wafer, and more particularly, to a batch-type heat treatment system, a batch-type heat treatment method, and a batch-type program, which batch-process a plurality of the objects.

2. Description of the Related Art

In processes of manufacturing a semiconductor device, a batch-type heat treatment system that batch-performs a film-forming process, an oxidation process, a diffusion process, or the like on a plurality of objects, such as a plurality of semiconductor wafers, is used. It is possible for the batch-type heat treatment system to efficiently process a semiconductor wafer, but it is difficult to achieve uniformity of processes performed on a plurality of semiconductor wafers.

Accordingly, for example, Patent Document 1 suggests a method of improving a yield of a semiconductor device by including three or more gas injectors for a top portion, a center portion, and a bottom portion to introduce gases into a diffusion furnace and independently control flow rates, thereby equalizing supply amounts of the gases.

However, in processes of manufacturing a phosphorous (P)-doped polysilicon film (D-poly film), a film thickness of and P concentration in the D-poly film are adjusted to optimum ranges by changing two heat treatment conditions, i.e., a film-forming temperature and a $PH_3$ flow rate. Such adjustments are performed based on experiments or senses of an operator of a heat treatment system since, both the film thickness of and the P concentration in the D-poly film are changed even when one heat treatment condition, for example the $PH_3$ flow rate, is changed. Accordingly, a heat treatment system and a heat treatment method are required for an operator who does not have any knowledge or experience with regard to a heat treatment system or process to easily adjust heat treatment performed on an object to be processed.

(Patent Document 1) Japanese Laid-Open Patent Publication No. hei 11~121389

SUMMARY OF THE INVENTION

The present invention provides a heat treatment system, a heat treatment method, and a program for easily adjusting a heat treatment performed on an object to be processed.

According to an aspect of the present invention, there is provided a heat treatment system including: a heating unit which heats inside of a processing chamber accommodating a plurality of objects to be processed; a plurality of process gas supply units which supply a process gas into the processing chamber; a heat treatment condition storage unit which stores heat treatment conditions according to process details, wherein the heat treatment conditions include a temperature in the processing chamber heated by the heating unit and a flow rate of a process gas supplied by the process gas supply unit; a model storage unit which stores a model indicating relationships between changes in a temperature in the process chamber and a flow rate of the process gas, and a change in a heat treatment characteristic showing a heat treatment result; a heat treatment unit which heat-treats the objects to be processed according to the heat treatment conditions stored in the heat treatment condition storage unit; a calculating unit which determines whether a heat treatment result obtained via the heat treatment of the heat treatment unit satisfies a target heat treatment characteristic, and when it is determined that the target heat treatment characteristic is not satisfied, calculates a temperature in the processing chamber and a flow rate of the process gas, which satisfy the target heat treatment characteristic, based on the heat treatment characteristic and the model stored in the model storage unit; and an adjusting unit which adjusts heat treatment to satisfy the target heat treatment characteristic by changing the temperature in the processing chamber and the flow rate of the process gas, which are stored in the heat treatment condition storage unit, respectively to the temperature in the processing chamber and the flow rate of the process gas, which are calculated by the calculating unit, and heat-treating the objects to be processed according to the changed heat treatment conditions.

According to another aspect of the present invention, there is provided a heat treatment method of a heat treatment system including a heating unit which heats inside of a processing chamber accommodating a plurality of objects to be processed, a plurality of process gas supply units which supply a process gas into the processing chamber, a heat treatment condition storage unit which stores heat treatment conditions according to process details, wherein the heat treatment conditions include a is temperature in the processing chamber heated by the heating unit and a flow rate of a process gas supplied by the process gas supply unit, and a heat treatment unit which heat-treats the objects to be processed according to the heat treatment conditions stored in the heat treatment condition storage unit, the heat treatment method including: storing a model indicating relationships between changes in a temperature in the process chamber and a flow rate of the process gas, and a change in a heat treatment characteristic showing a heat treatment result; determining whether a heat treatment result obtained via the heat treatment of the heat treatment unit satisfies a target heat treatment characteristic, and when the target heat treatment characteristic is not satisfied, calculating a temperature in the processing chamber and a flow rate of the process gas, which satisfy the target heat treatment characteristic, based on the heat treatment characteristic and the stored model; and adjusting heat-treatment to satisfy the target heat treatment characteristic by changing the temperature in the processing chamber and the flow rate of the process gas, which are stored in the heat treatment condition storage unit, respectively to the calculated temperature in the processing chamber and the calculated flow rate of the process gas, and heat-treating the objects to be processed according to the changed heat treatment conditions.

According to another aspect of the present invention, there is provided a program which operates a computer as: a heat treatment condition storage unit which stores heat treatment conditions according to process details, wherein the heat treatment conditions include a temperature in a processing chamber heated by a heating unit which heats inside of the processing chamber accommodating a plurality of objects to be processed, and a flow rate of a process gas supplied by a process gas supply unit which supplies a process gas into the processing chamber; a model storage unit which stores a model indicating relationships between changes in a temperature in the process chamber and a flow rate of the process gas, and a change in a heat treatment characteristic showing a heat treatment result; a heat treatment unit which heat-treats the objects to be processed according to the heat treatment conditions stored in the heat treatment condition storage unit; a calculating unit which determines whether a heat treatment result obtained via the heat treatment of the heat treatment unit satisfies a target heat treatment characteristic, and when it is determined that the target heat is treatment characteristic is not satisfied, calculates a temperature in the processing chamber and a flow rate of the process gas, which satisfy the target heat treatment characteristic, based on the heat treatment characteristic and the model stored in the model storage unit; and an adjusting unit which adjusts heat treatment to satisfy the target heat treatment characteristic by changing the temperature in the processing chamber and the flow rate of the process gas, which are stored in the heat treatment condition storage unit, respectively to the temperature in the processing chamber and the flow rate of the process gas, which are calculated by the calculating unit, and heat-treating the objects to be processed according to the changed heat treatment conditions.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 4 is a table showing relationships between a temperature and $PH_3$ flow rate in a predetermined zone, and a film thickness and P concentration of a phosphorous-doped polysilicon film (D-poly film) formed in each zone;

FIG. 6 is a table showing a film thickness and P concentration of a D-poly film, is input by an operator;

FIGS. 7A and 7B are tables showing examples of process recipes;

FIG. 8 is a table showing a measured film thickness and measured P concentration of a D-poly film;

FIGS. 9A and 9B are tables showing a calculated temperature and a calculated flow rate.

DETAILED DESCRIPTION OF THE INVENTION

Figure 1:
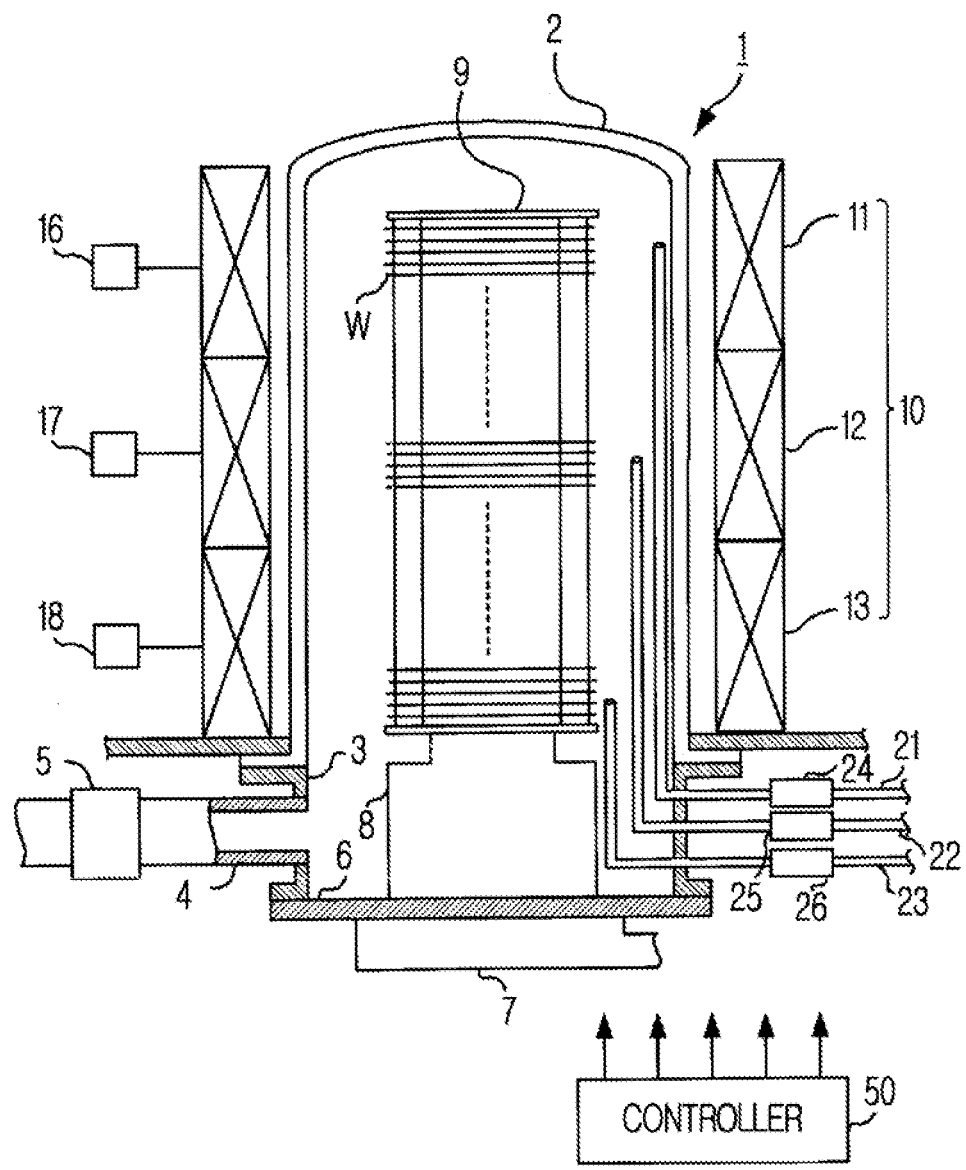
FIG. 1 is a view for showing a configuration of a heat treatment apparatus according to an embodiment of the present invention.

An embodiment of the present invention achieved on the basis of the findings given above will now be described with reference to the accompanying drawing. In the following description, the constituent elements having substantially the same function and arrangement are denoted by the same reference numerals, and a repetitive description will be made only when necessary.

Hereinafter, an embodiment of the present invention will be described based on an example where a heat treatment system, a heat treatment method, and a program of the present invention are applied to a batch-type vertical heat treatment apparatus shown in FIG. 1. Also, in the present embodiment, a phosphorus (P)-doped polysilicon film (D-poly film) may be formed by using a $SiH_4$ gas as a film-forming gas and a $PH_3$ gas as a doping gas.

As shown in FIG. 1, a heat treatment apparatus 1 according to the present embodiment includes a reaction tube 2 that has an approximate cylindrical shape and a ceiling. The reaction tube 2 is disposed such that a length direction of the reaction tube 2 is in a vertical direction. The reaction tube 2 is formed of a material having to excellent heat resistance and corrosion resistance, for example, quartz.

A manifold 3 having an approximate cylindrical shape is formed at a bottom of the reaction tube 2. A top of the manifold 3 is hermetically combined to the bottom of the reaction tube 2 An exhaust pipe 4 for exhausting a gas inside the reaction tube 2 is hermetically connected to the manifold 3. A pressure adjustor 5 including a valve, a is vacuum pump, etc, is formed at the exhaust pipe 4 and adjusts the inside of the reaction tube 2 to be at a desired pressure (vacuum level).

A cover body 6 is disposed at the bottom of the manifold (reaction tube 2). The cover body 6 is capable of moving up and down by a boat elevator 7. When the cover body 6 moves up by the boat elevator 7, the bottom (furnace entrance portion) of the manifold 3 (reaction tube 2) is closed and when the cover body 6 moves down by the boat elevator 7, the bottom (furnace entrance portion) of the reaction tube 2 is opened.

A wafer boat 9 is formed on the cover body 6 with a heat insulating tube (insulation body) 8 therebetween. The wafer boat 9 is a wafer holding unit for accommodating (holding) an object to be processed, for example, a semiconductor wafer W, and in the present embodiment, a plurality of semiconductor wafers W, for example, 150 semiconductor wafers W, may be accommodated at predetermined intervals in a vertical direction. Then, the semiconductor wafer W is loaded into the reaction tube 2 by accommodating the semiconductor wafer W in the wafer boat 9 and moving up the cover body 6 by using the boat elevator 7.

Figure 3:
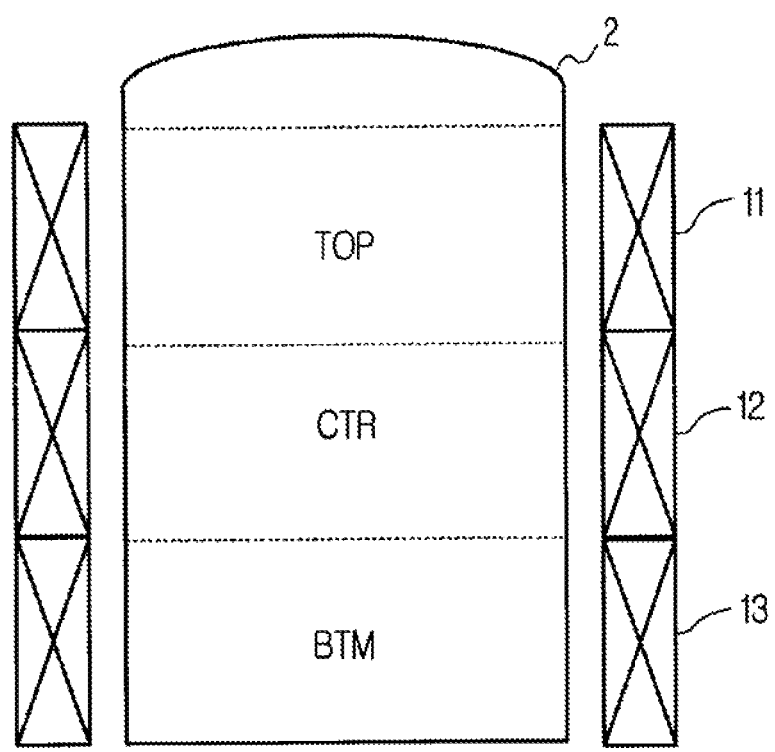
FIG. 3 is a view for showing zones in a reaction tube.

A heater unit 10 formed of, for example, a resistance heating element, is formed around the reaction tube 2 to surround the reaction tube 2. The inside of the reaction tube 2 is heated up to a predetermined temperature by the heater unit 10, and as a result, the semiconductor wafer W is heated up to the predetermined temperature. The heater unit 10 includes, for example, heaters 11 through 13 disposed in three stages, wherein power controllers 16 through 18 are respectively connected to the heaters 11 through 13. Accordingly, by independently supplying power to the power controllers 16 through 18, the heaters 11 through 13 may be independently heated up to desired temperatures. As such, the inside of the reaction tube 2 is divided into three zones as shown in FIG. 3, by the heaters 11 through 13. For example, when a top zone in the reaction tube 2 is to be heated, the heater 11 is heated up to a desired temperature by controlling the power controller 16. When a center (CTR) zone in the reaction tube 2 is to be heated, the heater 12 is heated up to a desired temperature by controlling the power controller 17. When a bottom (BTM) zone in the reaction tube 2 is to be heated, the heater 13 is heated up to a desired temperature by controlling the power controller 18.

Also, a plurality of process gas supply pipes for supplying process gases into the reaction tube 2 are formed at the manifold 3. In the present embodiment, a $SiH_4$ gas as a film-forming gas and a $PH_3$ gas as a doping gas may be used as the process gases supplied from the process gas supply pipes, since an impurity (P)-doped polysilicon film (D-poly film) is formed. Also, three $PH_3$ gas supply pipes 21 through 23 for supplying a $PH_3$ gas to the manifold 3 are shown in FIG. 1.

The $PH_3$ gas supply pipe 21 is formed to extend from a side of the manifold 3 to a top (TOP) vicinity of the wafer boat 9. The $PH_3$ gas supply pipe 22 is formed to extend from the side of the manifold 3 to a center (CTR) vicinity of the wafer boat 9. The $PH_3$ gas supply pipe 23 is formed to extend from the side of the manifold 3 to a bottom (BTM) vicinity of the wafer boat 9. Thus, when the $PH_3$ gas is supplied from the top zone in the reaction tube 2, the $PH_3$ gas is supplied into the reaction tube 2 through the $PH_3$ gas supply pipe 21, when the $PH_3$ gas is supplied from the center zone in the reaction tube 2, the $PH_3$ gas is supplied into the reaction tube 2 through the $PH_3$ gas supply pipe 22, and when the $PH_3$ gas is supplied from the bottom zone in the reaction tube 2, the $PH_3$ gas is supplied into the reaction tube 2 through the $PH_3$ gas supply pipe 23.

Flow rate adjustors 24 through 26 are respectively formed at the $PH_3$ gas supply pipes 21 through 23. Each of the flow rate adjustors 24 through 26 includes a mass flow controller (MFC) for adjusting a flow rate of the $PH_3$ gases which flows the inside of the $PH_3$ gas supply pipes 21 through 23. Accordingly, the $PH_3$ gases supplied from the $PH_3$ gas supply pipes 21 through 23 are adjusted to desired flow rates by the flow rate adjustors 24 through 26, and are supplied into the reaction tube 2.

Figure 2:
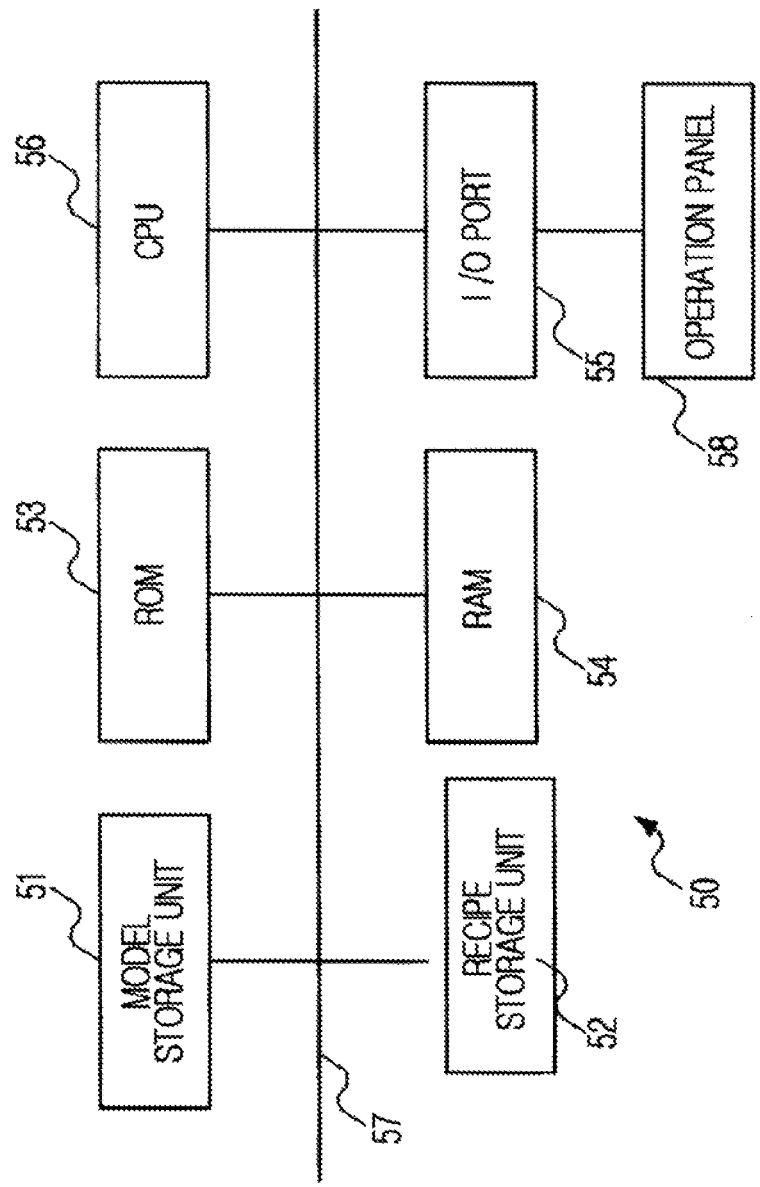
FIG. 2 is a diagram for showing a configuration example of a controller of FIG. 1.

Also, the heat treatment apparatus 1 includes a controller 50 for controlling process parameters, such as a gas flow rate, a pressure, and a temperature of a process atmosphere in the reaction tube 2. The controller 50 outputs a control signal to the flow rate adjustors 24 through 26, the pressure adjustor 5, the power controllers 16 through 18 of the heaters 11 through 13, etc. FIG. 2 shows a configuration of the controller 50.

As shown in FIG. 2, the controller 50 includes a model storage unit 51, a recipe storage unit 52, a read only memory (ROM) 53, a random access memory (RAM) 54, an is input/output (I/O) port 55, a central processing unit (CPU) 56, and a bus 57 which interconnects these elements.

The model storage unit 51 stores a model indicating relationships between changes in a temperature and a flow rate of $PH_3$ in the reaction tube, and changes in a film thickness of and P concentration in the D-poly film. The model will be described in detail later.

The recipe storage unit 52 stores a process recipe for determining a control order, according to a type of film-forming process performed by the heat treatment apparatus 1. The process recipe is a recipe prepared according to a process actually performed by a user, and defines a temperature change of each unit, a pressure change in the reaction tube 2, a timing of starting and stopping a gas supply, and a supply amount of a gas from when the semiconductor wafer W is loaded into the reaction tube 2 to when the semiconductor wafer W that has been processed is unloaded.

The ROM 53 includes an electrically erasable and programmable read only memory (EEPROM), a flash memory, a hard disk, etc. and is a recording medium having recorded thereon an operation program of the CPU 56, or the like.

The RAM 54 operates as a work area of the CPU 56.

The I/O port 55 supplies measurement signals regarding a temperature, a pressure, and a flow rate of a gas, to the CPU 56 and outputs a control signal from the CPU 56 to each unit (the pressure adjustor 5, the power controllers 16 through 18 of the heaters 11 through 13, the flow rate adjustors 24 through 26, or the like). Also, the I/O port 55 is connected to an operation panel 58 for the operator to operate the heat treatment apparatus 1.

The CPU 56 plays a pivotal role of the controller 50, executes an operation program stored in the ROM 53, and controls operations of the heat treatment apparatus 1 according to the process recipe stored in the recipe storage unit 52 based on an indication from the operation panel 58.

Also, the CPU 56 calculates the film thickness of and the P concentration in the D-poly film based on the model stored in the model storage unit 51, the temperature and the flow rate of $PH_3$ in the reaction tube 2. Then, the CPU 56 adjusts the temperature and the flow rate of $PH_3$ in the reaction tube 2 by outputting a control signal is to a power controller or the like, such that the film thickness of and the P concentration in the D-poly film is equal to the calculated film thickness and the calculated P concentration. Also, the CPU 56 updates the temperature and flow rate of $PH_3$ in the reaction tube 2 stored in the corresponding recipe storage unit 52 to the temperature and flow rate in the reaction tube 2, by which the calculated film thickness and the calculated P concentration are obtained.

The bus 57 transfers information between the units.

The model stored in the model storage unit 51 will now be described. As described above, the model storage unit 51 stores the model indicating the relationships between the changes in the temperature and the flow rate of $PH_3$ in the reaction tube 2, and the changes in the film thickness of and P concentration in the D-poly film.

Generally, when the temperature in the reaction tube 2 is increased, the film thickness of the D-poly film is increased and the P concentration in the D-poly film is decreased. Also, when the flow rate of the $PH_3$ is increased, the film thickness of the D-poly film is decreased and the P concentration in the D-poly film is increased. Also, when the temperature or flow rate of $PH_3$ in one zone of the reaction tube 2 is changed, the film thickness of and P concentration in the D-poly film formed on the semiconductor wafer W are affected not only in the corresponding zone, but also in other zones. FIG. 4 shows an example of the model.

As shown in FIG. 4, the model indicates how much a film thickness of and P concentration in a D-poly film formed in each zone change when a temperature of a corresponding zone is increased by 1° C. or a flow rate of $PH_3$ of the corresponding zone is increased by 1 sccm.

For example, a section surrounded by a dashed line in FIG. 4 indicates that when a temperature setting value of a top zone near Slot5 is increased by 1° C. by controlling the power controller 16 to heat the heater 11, a film thickness of a D-poly film formed in Slot5 is increased by 2 nm, a film thickness of a D-poly film formed in Slot85 is decreased by 0.1 nm, and P concentration in the D-poly film formed in Slot5 is decreased by 0.2 (E+20) atoms/cm$^3$.

Any model may be used as long as the model may indicate how much the film thickness of and P concentration in the D-poly film formed in each zone are changed is when the temperature or flow rate of $PH_3$ of a predetermined zone is changed. However, various other models may be used.

The model may be learned by adding an extended Kalman filter or the like to software to implement a learning function since a default value may not be at an optimum according to process conditions or a status of an apparatus. The learning function using the Kalman filter may be implemented by using, for example, a technique disclosed in US Patent Publication No. 5,991,525.

Figure 5:
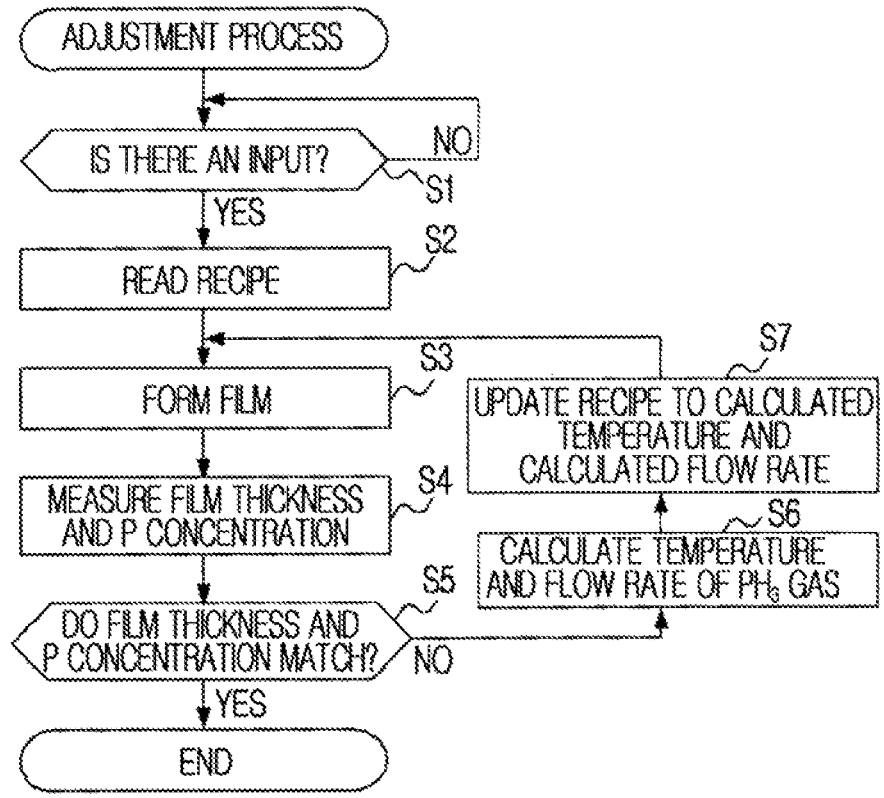
FIG. 5 is a flowchart for describing an adjustment process.

An adjustment method (adjustment process) for adjusting a film thickness and P concentration of a D-poly film formed, by using the heat treatment apparatus 1 described above will now be described. The adjustment process may be performed during a setup operation before a film-forming process, or simultaneously with the film-forming process. FIG. 5 is a flowchart for describing the adjustment process according to an embodiment of the present invention.

According to the adjustment process, the operator operates the operation panel 58 to select a process class (in the present embodiment, formation of a D-poly film by using a $SiH_4$ gas and a $PH_3$ gas) and input a target film thickness and P concentration of a D-poly film according to each of zones as shown in FIG. 6.

The controller 50 (CPU 56) determines whether required information, such as the process class, is input (operation S1), When it is determined that the required information is input (operation S1; Yes), the CPU 56 reads a process recipe corresponding to the input process class from the recipe storage unit 52 (operation S2). The process recipe includes process conditions, such as a pressure, a temperature, a flow rate of a $SiH_4$ gas, and a flow rate of a $PH_3$ gas in the reaction tube 2. As shown in FIGS. 7A and 7B, the process recipe includes a temperature (FIG. 7A) and a flow rate of a $PH_3$ gas (FIG. 7B) according to each of zones in the reaction tube 2.

Then, the CPU 56 moves down the boat elevator 7 (cover body 6) so as to dispose the wafer boat 9, on which the semiconductor wafer W (monitor wafer) is mounted in at least each zone, on the cover body 6. Next, the CPU 56 moves up the boat elevator 7 (cover body 6) so as to load the wafer boat 9 (monitor wafers) into the reaction tube 2. Then, the CPU 56 forms a D-poly film on the monitor wafers by controlling the pressure adjustor 5, the power controllers 16 through 18 of the heaters is 11 through 13, and the flow rate adjustors 24 through 26 according to a recipe read from the recipe storage unit 52 (operation S3).

When the film-forming process is ended, the CPU 56 moves down the boat elevator 7 (cover body 6) to unload the monitor wafers on which the D-poly film is formed, and transfers the monitor wafers to, for example, a measuring apparatus (not shown) to measure a film thickness of and P concentration in the D-poly film formed on each of the monitor wafers (operation S4). When the film thickness of and P concentration in the D-poly film formed on each monitor wafer are measured, the measuring apparatus transmits data of the measured film thickness and data of the measured P concentration of the D-poly film, for example as shown in FIG. 8, to the heat treatment apparatus 1 (CPU 56). Alternatively, the operator may operate the operation panel 58 to input measurement results.

The CPU 56 receives the data of the measured film thickness and the data of the measured P concentration of the P-poly film and determines whether the received data of the film thickness and the received data of the P concentration match the input target film thickness and the input target. P concentration of the D-poly film (operation S5).

When it is determined that the received data of the film thickness and the received data of the P concentration do not match the input target film thickness and the input target P concentration of the D-poly film (operation S5; No), the CPU 56 calculates (adjusts) the temperature and the flow rate of the $PH_3$ gas in each zone of the reaction tube 2 (operation S6).

The temperature and the flow rate of the $PH_3$ gas in each zone are calculated by, for example, calculating a temperature and a flow rate of $PH_3$ of a predetermined zone, which form a target film thickness and a target P concentration, by using an optimization algorithm, based on the model shown in FIG. 4 indicating the relationships between the temperature of the predetermined zone and the flow rate of $PH_3$ in the predetermined zone, and the film thickness of the D-poly film formed in each zone and the P concentration in the D-poly film formed in each zone. For example, when the measurement results of FIG. 8 are obtained, the temperature and the flow rate of $PH_3$ in each zone are calculated to be values (temperatures and flow rates) shown in FIGS. 9A and 9B.

Figure 10A:
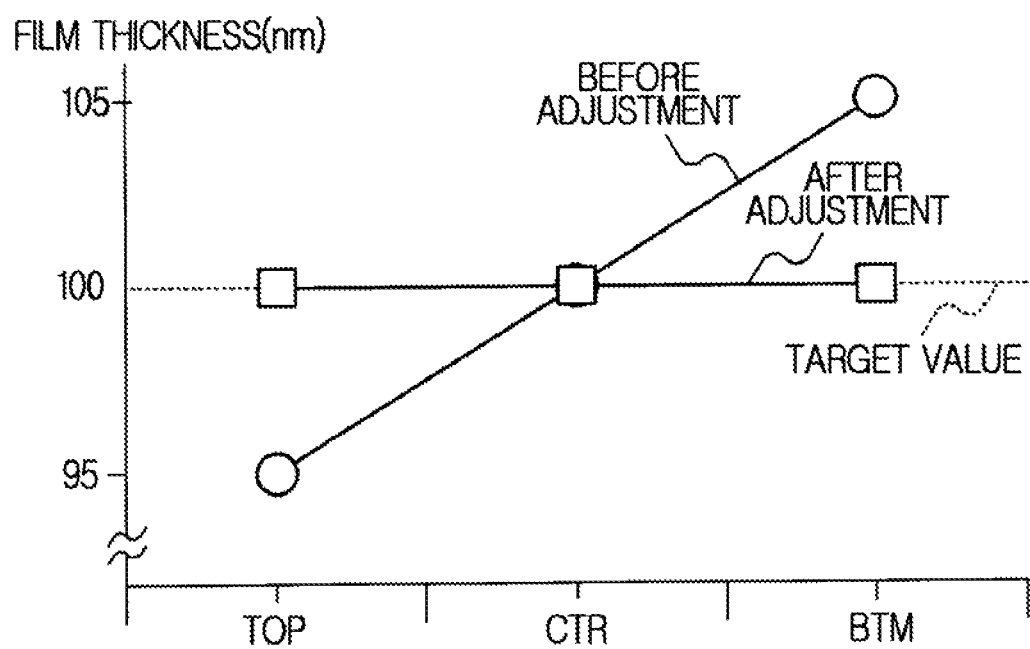
FIGS. 10A and 10B are graphs showing a film thickness and P concentration of a D-poly film after adjustment.
Figure 10B:
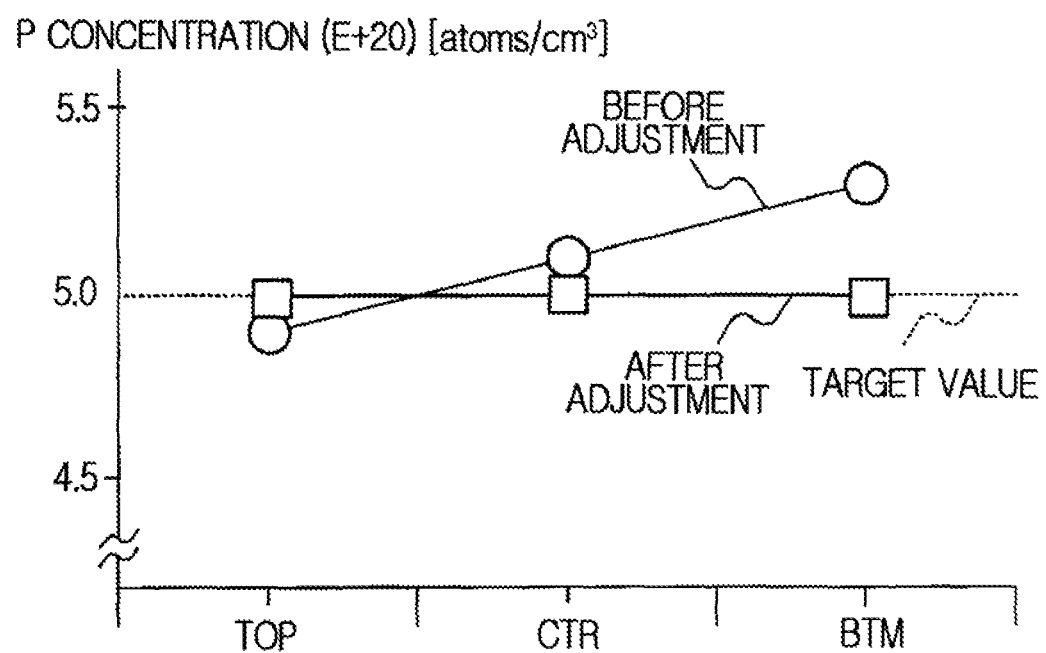

Then, the CPU 56 updates the temperature of each zone and the flow rate of the $PH_3$ gas of each zone read from the process recipe to the calculated temperature and the calculated flow rate (operation S7), and performs operations S3 through S5 again In other words, the CPU 56 controls the power controller 16 through 18 such that the temperature of the heater 11 becomes 582.8° C., the temperature of the heater 12 becomes 579.9° C., and the temperature of the heater 13 becomes 577.1° C. with respect to the temperature in the reaction tube 2. Also, when the $PH_3$ gas is supplied, the CPU 56 controls the flow rate adjustors 24 through 26 such that 42.2 sccm is supplied from the $PH_3$ gas supply pipe 21, 28.9 sccm is supplied from the $PH_3$ gas supply pipe 22, and 77.0 sccm is supplied from the $PH_3$ gas supply pipe 23. Then, the CPU 56 forms the D-poly film on each of the monitor wafers (operation S3), measures the film thickness of and P concentration in the D-poly film by using the measuring apparatus (operation S4), and determines whether the measured film thickness and the measured P concentration match the input target film thickness of and input target P concentration of the D-poly film (operation S5). In the present embodiment, as shown in FIGS. 10A and 10B, the measured film thickness and the measured P concentration matched the input target film thickness and the input target P concentration. As such, even an operator who does not have any knowledge or experience about a heat treatment apparatus or a heat treatment process was able to form a D-poly film on a surface of the semiconductor wafer W as targeted. Also, when it is determined that the measured film thickness and the measured P concentration do not match the input target film thickness of and input target P concentration of the D-poly film (operation S5; No), the CPU 56 performs operation S6, operation S7, and operations S3 through S5 again.

On the other hand, when it is determined that the measured film thickness and the measured P concentration match the input target film thickness of and input target P concentration of the D-poly film (operation S5; Yes), the CPU 56 ends the process.

As described above, according to the present embodiment, the D-poly film can be formed on the surface of the semiconductor wafer W as targeted by adjusting the temperature and the flow rate of the $PH_3$ gas in each zone by only inputting the process class, the target film thickness and the target P concentration of the target D-poly film Accordingly, even an operator who does not have any knowledge or experience is regarding a heat treatment apparatus or a heat treatment process can easily adjust a process.

The present invention is not limited to the above embodiments, and may be variously modified and applied. Hereinafter, other embodiments applicable to the present invention will be described.

In the above embodiments, the measured film thickness and the measured P concentration of the D-poly film are matched to the target film thickness and the target P concentration of the D-poly film, but alternatively, for example, an allowable range, such as about a ±1% range, may be set for the target film thickness and the target P concentration of the D-poly film, and the adjustment process may be ended when the measured film thickness and the measured P concentration of the D-poly film are within this range.

In the above embodiments, the $SiH_4$ gas is used as the film-forming gas and the $PH_3$ gas is used as the doping gas to form the P-doped polysilicon film (D-poly film), but a doped impurity is not limited to phosphorous and may be, for example boron (B). Also, the film-forming gas is not limited to $SiH_4$ and may be, for example, a $Si_2H_6$ gas. Also, a film that is formed is not limited to a polysilicon film, and may be any one of various films, such as a $SiO_2$ film and a SiN film.

In the above embodiments, the D-poly film having the target film thickness and the target P concentration is formed by adjusting the temperature and the flow rate of the $PH_3$ gas in each zone, but alternatively, for example, a film quality, such as sheet resistance, may be used as a target characteristic of a film.

In the above embodiments, the present invention is described by the film-forming process of D-poly film as an example, but a type of a process is arbitrary, and the present invention may be applied to any one of several batch-type heat treatment apparatuses, such as a chemical vapor deposition (CVD) apparatus and an oxidation apparatus, which form another type of film.

Also, in the above embodiments, a film thickness and impurity concentration of a film formed via a film-forming process are adjusted, but for example, the present invention may be used to optimize various heat treatment results, such as a diffusion concentration or a diffusion depth during an impurity diffusion process, an etching rate, is reflectivity, an embedding characteristic, and step coverage.

In the above embodiment, three $PH_3$ gas supply pipes are formed in the heat treatment apparatus 1, but the number of $PH_3$ gas supply pipes may be Z equal to or more than 4, or arbitrary. Also, the number of stages (number of zones) in a heater, the number of monitor wafers extracted from each zone, or the like may be arbitrarily set.

In the above embodiments, a batch-type heat treatment apparatus having a single pipe structure is used, but alternatively, for example, a batch-type heat treatment apparatus having a reaction tube 2 of a double pipe structure of an inner pipe and an outer pipe may be used. Also, the present invention is not limited to processing a semiconductor wafer, and for example, a flat panel display (FPD) substrate, a glass substrate, a plasma display panel (PDP) substrate, or the like may be processed.

The controller 50 according to an embodiment of the present invention may be realized by using a general computer system, not by an exclusive system. For example, the controller 50 performing the above-described process may be formed by installing a program for executing the above process in a general-purpose computer from a recording medium (flexible disk, CD-ROM, or the like) storing the program.

A unit for supplying the program is arbitrary. The program may be supplied through a predetermined recording medium as described above, but alternatively, for example, may be supplied through a communication wire, a communication network, or a communication system. Here, for example, the program may be displayed on a bulletin board system (BBS) of the communication network and provided together with carrier waves through a network. Then, the program provided as such may be activated, and performed like another application program under a control of an operating system (OS) so as to perform the above process.

According to the present invention, heat treatment performed on an object to be processed may be easily adjusted.

The present invention is useful for a heat treatment system for heat-treating an object to be processed, such as a semiconductor wafer.

What is claimed is:

1. A heat treatment system which forms an impurity-doped polysilicon film on an object, the heat treatment system comprising:
   a heating unit which is configured to heat inside of a processing chamber accommodating a plurality of objects;
   a plurality of gas supply units which is configured to supply a film-forming gas for forming a polysilicon film and a doping gas into the processing chamber;
   a heat treatment condition storage unit which is configured to store heat treatment conditions, the heat treatment conditions including a temperature in the processing chamber heated by the heating unit and a flow rate of a film-forming gas and a doping gas supplied by the gas supply unit;
   a model storage unit which is configured to store a model indicating relationships between changes in a temperature in the process chamber and a flow rate of the doping gas, and a change in a film thickness of the impurity-doped polysilicon film and an impurity concentration in the impurity-doped polysilicon film;
   a heat treatment unit which is configured to control the heating unit to form impurity-doped polysilicon film on the objects according to the heat treatment conditions stored in the heat treatment condition storage unit;
   a calculating unit which is configured to determine whether the film thickness of the impurity-doped polysilicon film formed by the control of the heat treatment unit and the impurity concentration in the impurity-doped polysilicon film satisfy within a predetermined range, and when it is determined that the predetermined range is not satisfied, calculate a temperature in the processing chamber and a flow rate of the doping gas, which satisfy the predetermined range, based on the film thickness of the impurity-doped polysilicon film, the impurity concentration in the impurity-doped polysilicon film, and the model stored in the model storage unit; and
   an adjusting unit which is configured to adjust heat treatment to satisfy the predetermined range of the impurity-doped polysilicon film and the impurity concentration in the impurity-doped polysilicon film by changing the temperature in the processing chamber and the flow rate of the doping gas, which are stored in the heat treatment condition storage unit, respectively to the temperature in the processing chamber and the flow rate of the doping gas, which are calculated by the calculating unit, and heat-treating the objects according to the changed heat treatment conditions.

2. The heat treatment system of claim 1, wherein the processing chamber is divided into a plurality of zones, the model stored in the model storage unit indicates relationships between changes in a temperature in the processing chamber and a flow rate of the doping gas according to each of the plurality of zones, and a change in the film thickness of the impurity-doped polysilicon film and the impurity concentration in the impurity-doped polysilicon film according to each of the plurality of zones, the heating unit is capable of setting the temperature in the processing chamber according to each of the plurality of zones, and the gas supply unit is capable of setting the flow rate of the doping gas according to each of the plurality of zones in the processing chamber.

\* \* \* \* \*